United States Patent [19]
Chung

[11] Patent Number: 5,058,047
[45] Date of Patent: Oct. 15, 1991

[54] SYSTEM AND METHOD FOR PROVIDING DIGITAL FILTER COEFFICIENTS

[75] Inventor: Sanguoon Chung, Salinas, Calif.

[73] Assignee: Advanced Micro Devices, Inc., Austin, Tex.

[21] Appl. No.: 359,022

[22] Filed: May 30, 1989

[51] Int. Cl.$^5$ ............................................. G06F 15/31
[52] U.S. Cl. ........................... 364/724.19; 364/724.16
[58] Field of Search ....................... 364/724.19, 724.16

[56] References Cited
U.S. PATENT DOCUMENTS

| | | | |
|---|---|---|---|
| 4,349,889 | 9/1982 | van den Elzen et al. | 364/724.19 |
| 4,696,015 | 9/1987 | Palicot et al. | 364/724.19 |
| 4,791,390 | 12/1988 | Harris et al. | 364/724.19 |

Primary Examiner—David H. Malzahn

[57] ABSTRACT

There is disclosed a system and method for generating coefficients for use in a digital filter. The coefficients are generated utilizing an iterative adaptive process employing a least mean square process wherein the filter coefficients are updated by an amount during each iteration dependent upon the stochastic average of the gradient generated during prior iterations. The response of a filter standard to an applied input signal is combined with a response of the adaptive filter coefficients to generate, during each iteration, an error signal. If the error signal is less than a predetermined standard, the iterative process is stopped, and the last used filter coefficients are utilized as the final filter coefficients of the digital filter.

20 Claims, 5 Drawing Sheets

FIG. 1 SLAC SIGNAL PROCESSING

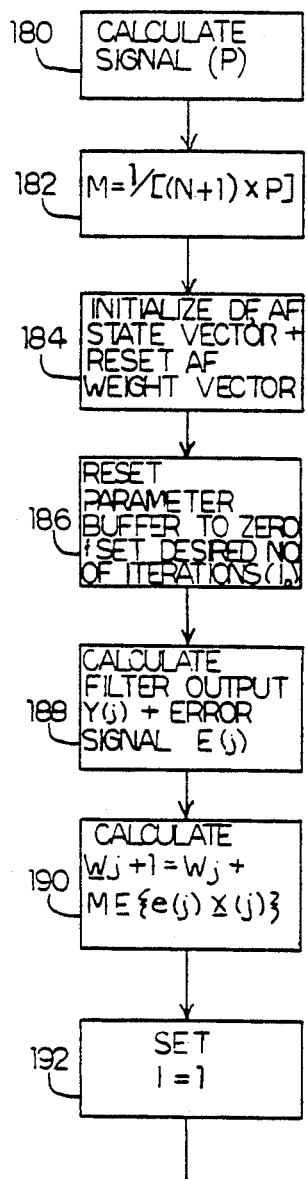
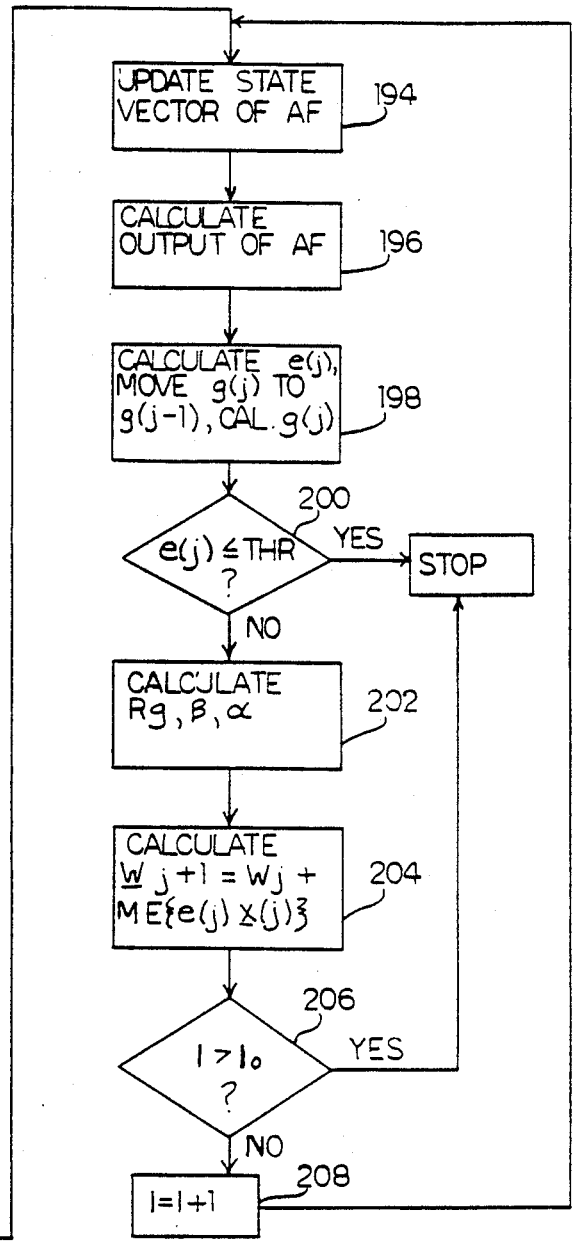
FIG. 5

SYSTEM AND METHOD FOR PROVIDING DIGITAL FILTER COEFFICIENTS

BACKGROUND OF THE INVENTION

The present invention relates in general to a system and method for generating coefficients for digital filters. The present invention more particularly relates to such a system and method wherein an iterative adaptive process is utilized which employs a least mean square processor with the step size of the filter coefficients in process being related to the stochastic average of the gradients generated during the iterative process.

Digital filters find application in digital circuits, including those implemented in integrated circuit form. Such filters exhibit many advantages such as, for example, high reliability, no drift with time, no drift with temperature, unit-to-unit repeatability, and superior transmission performance. Digital filters can include one or more sections, the number of sections depending mainly upon the desired accuracy in realizing the nominal characteristics of the filter. In other words, an increase in the number of sections a digital filter provides a corresponding increase in the accuracy to which the desired filter characteristics can be obtained.

One application for digital filters is in a subscriber line audio-processing circuit (SLAC). SLAC devices are utilized in telephone systems to perform CODEC and filter functions associated with the two-wire section of the subscriber line circuiting in a digital switch. To that end, these circuits provide conversion of analog voice signals to digital pulse code modulated (PCM) samples for placement of the PCM signals onto a PCM highway, and conversion of digital PCM signals received from the PCM highway into analog voice signals. During this conversion process, digital filters are used to band-limit the voice signals, set gain, perform trans-hybrid balancing, provide adjustment of termination impedance, and provide frequency attenuation adjustment (equalization) of the receive and transmit paths.

To implement a digital filter, it is necessary to provide a filter coefficient for each section or tap of the filter. This is generally accomplished by storing the filter coefficient in a memory of the device employing the filter. The filter coefficient for each filter section is transformed from a single number into a plurality of coefficients known as Canonic Signed Digit (CSD) coefficients before storage into memory. CSD coefficients and the manner in which they may be derived from a single coefficient are well known in the art.

In the prior art, the coefficients for the digital filter section (before conversion into CSD coefficients) were generated by an adaptive iterative least mean square process. During this prior art process, the coefficients of the filter section have been, during each iteration, updated from the last iteration by the instantaneous gradient value. In such a process, the instantaneous gradient, based upon a single sample, is the product of the instantaneous value of a time-varying input signal and the simultaneous instantaneous value of an error signal. The error signal is generated by applying the input signal to both a desired filter characteristic and the filter coefficients in process to generate first and second outputs, and then generating the difference between these output. When the error signal is detected to be below a predetermined standard, the process is stopped and the last set of coefficients used in the process are the final coefficients to be used in the filter after conversion to the CSD format.

While the aforementioned iterative process has been adequate in its use to determine digital filter coefficients, there remains the need for improvement in such processes. More particularly, the prior art least mean square iterative process is not computationally efficient and reasonably fast in convergence unless an optimal step-size is used in a noise-free environment. Unfortunately, it is difficult to find the optimal step-size that satisfies both requirements of fast tracking capability during an adaptive process and small misadjustment error after convergence.

In addition, the foregoing process is sensitive to noise in generating the gradient because the gradient is based upon a single time sample. Hence in practice, the prior art iterative process has required considerable time for completion to arrive at an accurate determination of digital filter coefficients given the fact that it is sensitive to noise and the variable optimum step-size is difficult to determine.

It is therefore a general object of the present invention to provide a new and improved system and method for generating digital filter coefficients.

It is a further object of the present invention to provide such a system and method which is insensitive to noise and wherein the optimum step-size is readily determined.

It is a still further object of the present invention to provide such a system and method wherein the step-size is related to the stochastic average of the gradients generated during the adaptive process.

SUMMARY OF THE INVENTION

The invention provides a system for generating coefficients for use in a digital filter. The system includes means for providing data indicative of a desired filter characteristic and iterative processing means for generating at least one filter coefficient and a gradient for each iteration. The iterative processing means includes means for varying the at least one coefficient during each iteration by an amount related to the stochastic average of the gradients. The system further includes comparing means for comparing the generated at least one coefficient to the desired filter characteristic and means for terminating the iterative processing means when the at least one coefficient is within a given range of the desired filter characteristic.

The invention further provides a system for generating a set of coefficients for use in a digital filter having one or more sections. The system includes input means for receiving an applied time-varying signal and filter standard means for providing a desired filter characteristic. The filter standard means has an input coupled to the input means for acting upon the time-varying signal and an output for providing a standard filtered signal. The system further includes iterative processing means having an input coupled to the input means for acting upon the time-varying signal, wherein the iterative processing means includes filter coefficient generating means for generating, during each iteration, a set of filter coefficients equal in number to the number of sections of the digital filter and iterative processing means having an output for providing an intermediate filtered signal during each iteration. The system further includes combining means for combining the standard filtered signal with the intermediate filtered signal for providing an error signal for each iteration. The iterative processing means also includes gradient generating means for generating a gradient for each iteration and coefficient varying means for varying the set of coefficients after each iteration by an amount related to the stochastic average of the gradients. The system further includes means for terminating the iterative processing means when the error signal is below the predetermined standard so that, when the iterative processing means is terminated, the current set of coefficients represent the final set of coefficients for the digital filter.

The invention still further provides a method for generating coefficients for use in a digital filter. The method includes the steps of providing a desired filter characteristic, iteratively generating at least one filter coefficient and a gradient for each iteration by varying the at least one coefficient during each iteration by an amount related to the stochastic average of the gradients, comparing the generated coefficients to the desired filter characteristic, and terminating the iterative generation of the at least one coefficient when the at least one coefficient is within a given range of the desired filter characteristic.

The present invention still further provides a method for generating a set of coefficients for -use in a digital filter having one or more sections. The method includes the steps of providing a desired filter characteristic, iteratively generating a set of filter coefficients equal in number to the number of sections of the digital filter and applying the desired filter characteristic to a time-varying signal to generate a first output. The method further includes the steps of applying the iteratively generated set of filter coefficients to the time-varying signal to generate a second output, combining the first and second outputs to generate an error signal during each iteration, generating a gradient for each iteration responsive to the error signal, varying the iteratively generated filter coefficients during each iteration by an amount related to the stochastic average of the generated gradients, and terminating the iterative generation of the set of filter coefficients when the error signal is below a predetermined standard.

BRIEF DESCRIPTION OF THE DRAWINGS

The features of the present invention which are believed to be novel are set forth with particularity in the appended claims. The invention, together with the advantages thereof, may best be understood by making reference to the following description in conjunction with the accompanying drawings, in the several figures of which like reference numerals identify identical elements, and wherein:

DESCRIPTION OF THE PREFERRED EMBODIMENTS

Figure 1:
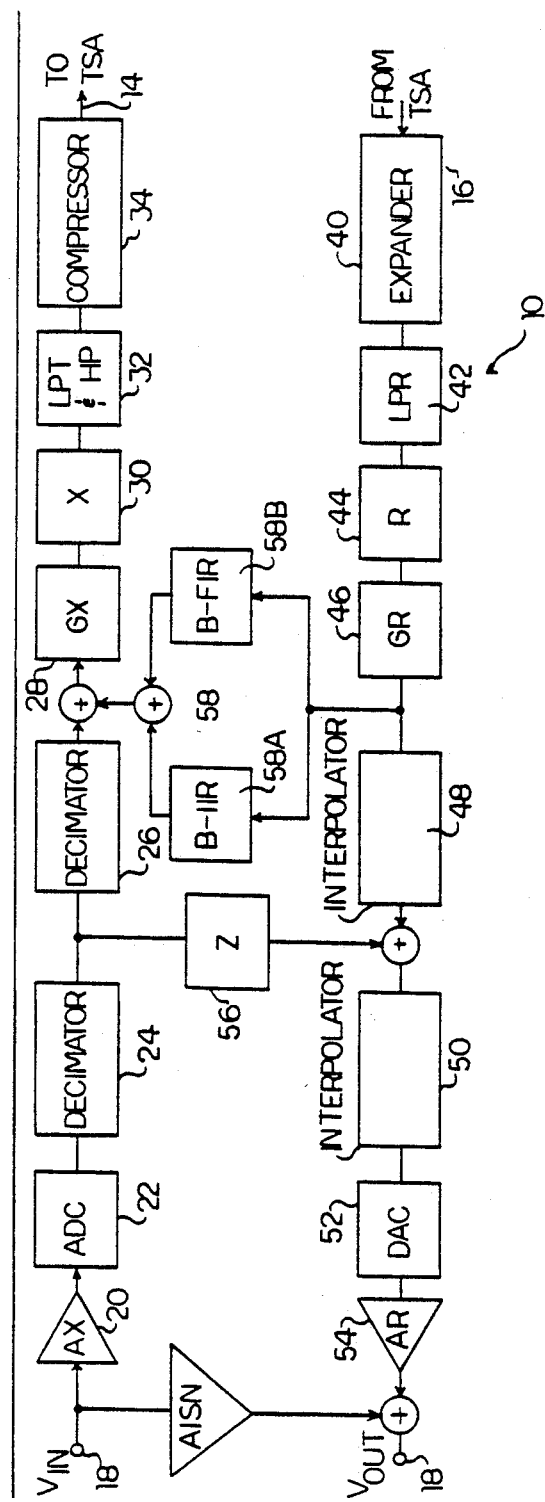
FIG. 1 is a block diagram of the signal processing circuitry of a subscriber line audio-processing circuit which includes digital filters, the coefficients of which, may be generated by a system and method embodying the present invention.

Referring now to FIG. 1, it illustrates, in block diagram form, the signal processing circuitry of a subscriber line audio-processing circuit in which the present invention may be utilized to an advantage. The subscriber line audio-processing circuit (SLAC) performs the CODEC and filter functions associated with the two-wire section of the subscriber line circuitry in a digital switch. In general, these f-unctions involve converting an analog voice signal into digital pulse code modulated (PCM) samples for placing the PCM samples onto a PCM highway and converting digital PCM samples received from the PCM highway into an analog signal.

The circuit 10 of FIG. 1 generally includes a first input 12 for receiving analog voice signals, a first output 14 for transferring the PCM samples to a time slot assigning circuit for placement of the PCM samples onto the PCM highway, a second input 16 adapted to be coupled to the time slot assigning circuit for receiving PCM samples from the PCM highway, and a second output 18 for providing analog signals representative of the PCM samples received from the PCM highway. The signal processing circuitry extending between the first input 12 and the first output 14 represents the transmit signal processing path of the circuit and the signal processing circuitry from the second input 16 to the second output 18 represents the receive signal processing path of the circuit.

The transmit signal processing path includes an amplifier 20, an analog-to-digital converter 22, a first decimator 24, a second decimator 26, an attenuator 28, a first programmable digital filter (X) 30, a high-pass filter 32, and a data compressor 34. The amplifier 20 is an analog amplifier and provides analog signal gain into the analog-to-digital converter 22. The analog-to-digital converter 22 converts the analog voice signals to PCM data samples. The decimators 24 and 26 reduce the high input sampling rate to 16 khz. The attenuator 28 provides signal level correction into the filter 30. The filter 30 is, for example, a six-tap finite input response filter which provides frequency response correction. The high-pass filter 32 rejects low frequencies such as frequencies in the range of 50 hz or 60 hz for the purpose of filtering, for example, AC line noise. Lastly, the compressor 34 compresses the digital PCM samples in a known manner.

The receive signal processing circuitry includes an expander 40, a low-pass filter 42, a second programmable digital filter (R) 44, an attenuator 46, interpolators 48 and 50, a digital-to-analog converter 52, and an amplifier 54. The expander 40 expands the compressed digital PCM samples received from the PCM highway and the low-pass filter 42 filters the expanded digital PCM samples. The second programmable filter 44 is preferably a 6-tap. finite input response filter which operates at a 16 khz sampling rate and provides frequency response correction. The attenuator 46 provides signal amplitude scaling into the interpolators 48 and 50. The interpolators 48 and 50 increase the sampling rate for the digital-to-analog conversion performed by the digital-to-analog converter 52. Amplifier 54 provides an analog loss to provide amplitude correction into the output terminal 18.

Coupled across the transmit and receive processing paths is a third programmable filter (Z) 56. Filter 56 provides feedback from the transmit signal path to the receive signal path to modify the effective input impedance into the system. Hence, filter 56 provides impedance matching to assure efficient signal transfer. Also coupled across the receive and transmit signal processing path is a fourth programmable filter (B) 58. Filter 58 includes a single-pole infinite impulse response filter section 58a and 8-tap finite input response filter section 58b. Filter 58 provides trans-hybrid balance between the receive and transmit signal processing circuits to eliminate echo within the system.

The programmable filters 30, 44, 56, and 58 may have their coefficients for each of their sections determined by the system and method of the present invention and stored in memory. As previously mentioned, the coefficients of these filters are stored after being converted to the Canonic Signed Digit (CSD) format. Such coefficient conversion is well known in the art and need not be described herein.

Figure 2:
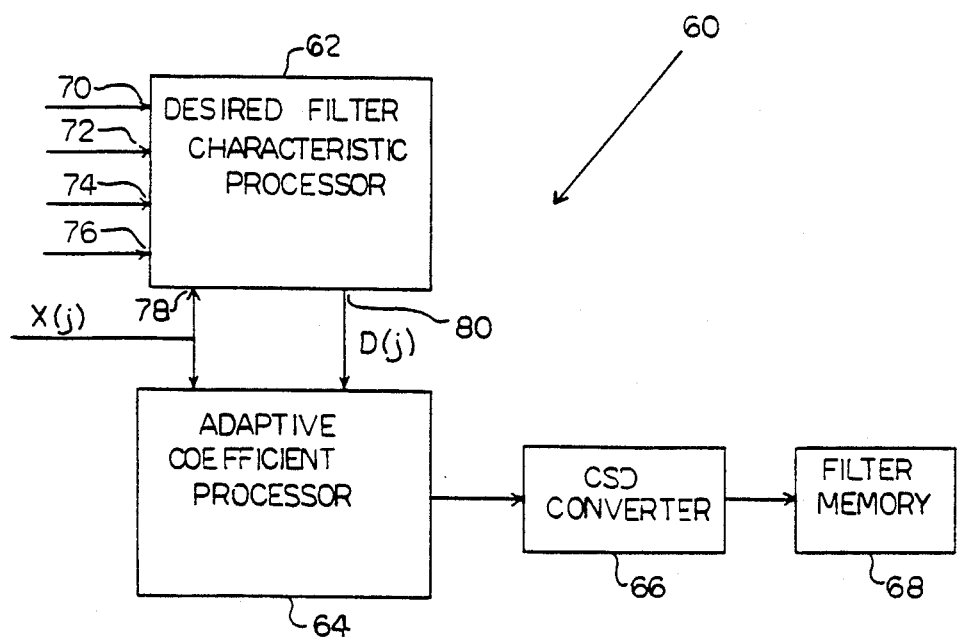
FIG. 2 is an overall system block diagram embodying the present invention.

Referring now to FIG. 2, it illustrates a system embodying the present invention for generating the coefficients of digital filters, such as filters 30, 44, 56 and 58 illustrated in FIG. 1 and then converting the filter coefficients to the CSD format then storing the coefficients in memory. The system 60 generally includes a desired filter characteristic processor 62 and an adaptive coefficient processor 64. The adaptive coefficient processor is arranged to provide the final filter coefficients to a CSD converter 66 for converting the filter coefficients into the CSD format. The CSD converter 66 is coupled to a filter memory 68 for storing the CSD formatted filter coefficients into the memory of the subscriber line audio-processing circuit.

The desired filter characteristic processor preferably takes the form of an IBM compatible computer operating under a commercially available software program referred to as AmSLAC-II available from Advanced Micro Devices, Inc. of Sunnyvale, California, and is disclosed in the AMSLAC-II Technical Manual (Order No. 10249 A). The desired filter characteristic processor having this configuration provides a desired filter characteristic in response to inputted input information such as line impedance, desired terminating impedance, the actual terminating impedance at the exchange, the attenuation of attenuator 46 of FIG. 1, the desired gain of attenuator 28, the receive buffer transfer function, the transmit buffer transfer function, fuse resistances, and the two-wire return loss. In response to this information, the desired filter characteristic processor models the subscriber line audio-processing circuit to provide the desired filter characteristic for each of the programmable filters. The aforementioned input information is inputted into the desired filter character processor at inputs 70, 72, 74, and 76, for example.

The desired filter characteristic processor 62 includes a further input 78 for receiving a time-varying input signal X(j). After applying the desired filter characteristic to the input signal, the processor 62 provides the resulting output at an output . 80. The resulting output of applying the desired filter characteristic to the input signal is identified as d(j).

The adaptive coefficient processor 64, as will be seen subsequently with reference to FIGS. 3 through 5, performs an iterative least means square process for generating the digital filter coefficients. Unlike the prior art least means square process however, wherein the coefficient step-size was determined by the instantaneous value of the iterative gradient, the adaptive coefficient processor of the present invention generates the adaptive coefficient step-size in accordance with the stochastic average of the iterative gradients. Because the step-sizes are the result of the stochastic average of the gradients, the step-sizes are not dependant upon the instantaneous value of the gradients so that the iterative process which results is insensitive to noise in the gradient estimate and fast in convergence without having to use an optimal step-size. Thus, while the least mean square process estimates its gradient on a sample-by-sample basis, the least means square process of the instant invention which utilizes stochastic averaging in estimating its gradient provides an estimate of the correlation between the adaptive error and the input signal.

In accordance with the present invention, the filter coefficients are updated according to the following formula:

$$W(j+1) = W(j) + \mu \hat{E}\{e(j)X(j)\} = W(j) - \mu G(j)$$

G(j) is given by the expression below.

$$G(j) = \alpha(j)\beta(j)G(j-1) + \alpha(j)e(j)X(j)$$

G(j) is the time-varying gradient vector estimate obtained by estimating the cross-correlation between the adaptive error signal, e(j), and the system input signal, X(j), i.e.

$$G(j) = \hat{E}\{e(j)X(j)\}$$

The $\alpha(j)$ and $\beta(j)$, are respectively, an adaptive gain factor and an adaptive forgetting factor.

In the iterative process of the present invention, as the process converges, the adaptive error is initially large and highly non-stationary and the cross-correlation between the adaptive error and system input signals yields a large gradient estimate and hence provides fast convergence. After convergence, the adaptive error is small, almost random and stationary, and the cross-correlation yields a small gradient estimate and hence a small misadjustment error with fine tracking. Therefore, since the iterative process of the present invention automatically adjusts the time-varying gradient estimate according to the gradient of the adaptive error surface it ensures that convergence is always in the optimal way.

As will be seen hereinafter with respect to FIGS. 3 and 4, an iterative processing circuit is provided which includes an adaptive 1-pole correlator which provides an output signal which is the time-varying gradient estimate given below.

$$G(j) = \hat{E}\{e(j)X(j)\} = \alpha(j)e(j)X(j) + \alpha(j)\beta(j)G(j-1)$$

For each of the foregoing expressions, it should be kept in mind that these expressions relate to digital operations where a "j" relates to a value taken during a current time period and wherein a "j‘1" relates to a value taken during a previous time interval. In the expression immediately above, the adaptive gain, $\alpha(j)$ is used for rapid tracking capability and stability, and the adaptive forgetting factor $\beta(j)$ is used to maximize the averaging effect (for insensitivity to gradient estimation noise) for given error statistics, to yield a small misadjustment error.

The adaptive forgetting factor $\beta(j)$ is $1-$ the estimate of the normalized autocorrelation of the gradient estimate, and is given below.

$$\beta(j) = 1 - R_g(j)$$

The estimate of the normalized autocorrelation of the radient estimate, or $R_g(j)$ is given below.

$$R_g(j) = \frac{|\hat{E}\{\hat{g}(j)\hat{g}(j-1)\}|}{[\hat{E}\{\hat{g}^2(j)\}\hat{E}\{\hat{g}^2(j-1)\}]^{\frac{1}{2}}}$$

where $\hat{g}(j) = \hat{E}\{e(j)X(j)\}$

The 1-pole correlator referred to previously for implementing the present invention has the following transfer function.

$$H(z) = \alpha(j)/(1-j)\beta(j)z^{-1})$$

The forgetting factor, $\beta(j)$ is obtained from the expression above of $1-$ the estimate of the normalized autocorrelation of the gradient estimate, and the adaptive gain $\alpha(j)$ is obtained so as to keep the dc gain less than 1.0 for stability. In other words, the following expression must be adhered to.

$$\frac{\alpha(j)}{1-\alpha(j)\beta(j)} = \gamma < 1.0$$

In general, the larger the value of gamma used, the faster the convergence.

As can been seen from the foregoing, during the iterative process, and more particularly at the end of each iteration, the adaptive coefficient processor generates two filter coefficients $(\beta,\alpha)$ related to the stochastic average of the gradients generated by the system. As can also be noted in FIG. 2, the adaptive coefficient processor is coupled to the input signal $X(j)$. Before a new set of filter coefficients is generated, the input signal is applied to the coefficients in the adaptive coefficient processor to provide a second output signal resulting from the application of the set of filter coefficients to the input signal. A combining circuit within the adaptive coefficient processor then combines the output d(j) of the desired filter characteristic processor with the second output signal generated by the adaptive coefficient processor to develop the error signal e(j). The error signal is then multiplied by the input signal from which it resulted to derive a new gradient which is then utilized for generating a new stochastic average of the gradients which in turn is used for generating a new set of filter coefficients. At the end of each iteration, the error signal is compared to a predetermined standard. If the error signal is less than a predetermined standard, the iterative process is stopped and the set of coefficients used in the last iteration are the final coefficients for the digital filter. Hence, at the end of each iteration, through this process, generated filter coefficients are compared to the desired filter characteristic and, if the filter coefficients are within a given range of the desired filter characteristic, the iterative process is stopped and the present set of generated filter coefficients represent the final filter coefficients for the digital filter.

When the iterative process is completed, the final set of generated filter coefficients is transferred to the CSD converter which converts the coefficients to the Canonic Signed Digit format. After being so converted, the coefficients in the CSD format are transferred to the filter memory of the subscriber line audio-processing circuit. Such memory may be in the form of a random access memory (RAM).

Figure 3:
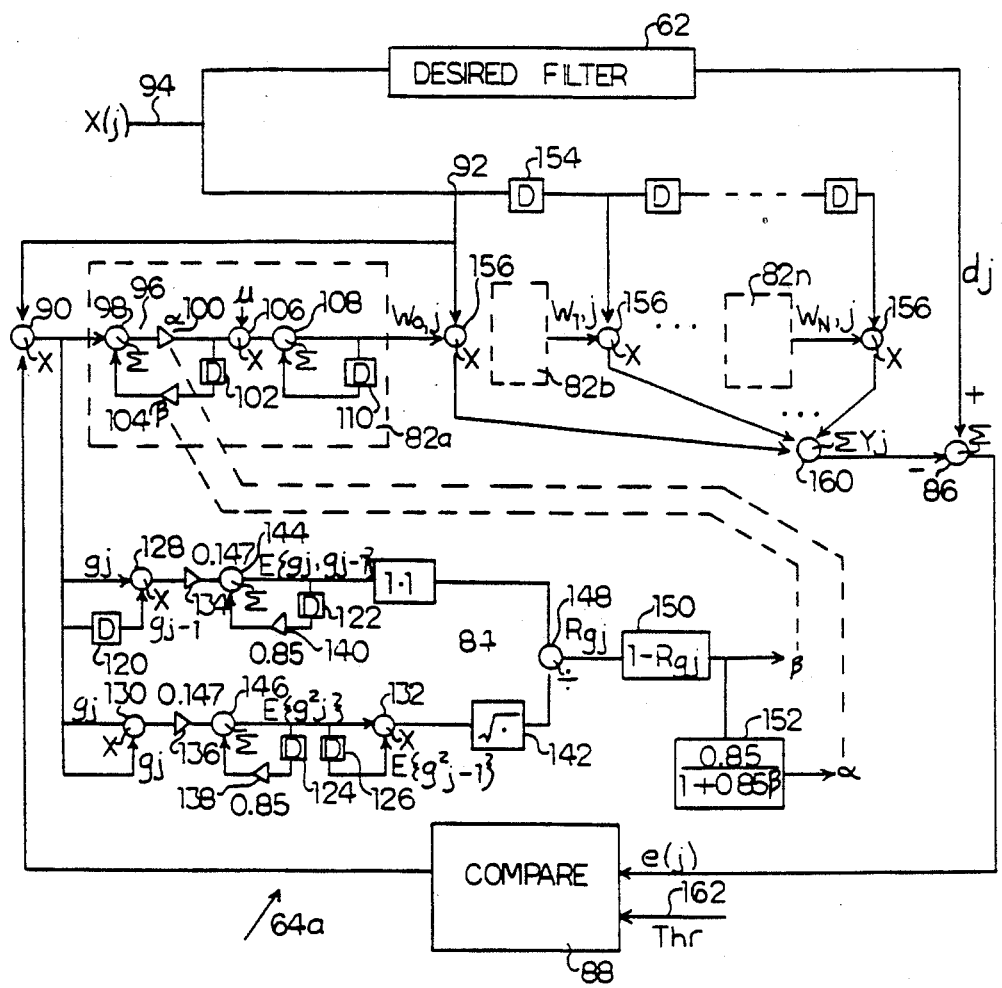
FIG. 3 is a schematic circuit diagram illustrating the manner in which the present invention may be implemented in hardware form in accordance with a first embodiment of the present invention.

Referring now to FIG. 3, FIG. 3 illustrates in hardware circuit diagram form an adaptive coefficient processor 64a structured in accordance with a first embodiment of the present invention in conjunction with the desired filter characteristic processor 62 as previously described.

The adaptive coefficient processor generally includes a plurality of filter coefficient generating circuit 82a, 82b through 82n. In practice, one such filter coefficient circuit is provided for each section of the digital filter for each the coefficients are to be generated. In other words, if the digital filter includes six sections, then there would be six filter coefficient generating circuits provided.

The adaptive coefficient processor also includes circuits for generating the pair of stochastic averaging coefficients, namely, $\beta$, the adaptive forgetting- factor, and $\alpha$, the adaptive gain. That circuit is identified by reference character 84. The adaptive coefficient processor 64a further includes a combining circuit 86, a compare circuit 88, and a multiplication circuit 90. The adaptive coefficient processor includes an input 92 which is coupled to the input means 94 of the system for receiving the time-varying input signal.

The filter coefficient generating circuit 82a includes a 1-pole correlator 96 comprising a summing circuit 98, an amplifier 100 having a gain equal to the adaptive gain, a delay network 102, and another amplifier 104 having a gain equal to the forgetting factor.

The filter coefficient generating circuit 82a further includes a multiplying circuit 106 which multiplies the results of the 1-pole correlator with a stability factor $\mu$ which is a step-size . The filter coefficient generating circuit 82a further includes a summing circuit 108 and a delay network 110. Each of the delay networks illustrated in FIG. 3 is a delay network which delays signals applied at its input by one time period. Each of the coefficient generating circuits 82b through 82n are identical to circuit 82a and therefore, only circuit 82a has been shown in detail herein.

The 1-pole correlator circuit 96 implements the generation of the amount by which the coefficients are to be varied in accordance with the stochastic average of the previously generated gradients, and the summing circuit 108 adds that amount to the previous coefficient for generating the new coefficient during the next iteration. The gain values for the amplifiers 100 and 104 are obtained from the circuit 84 which generates the pair of stochastic averaging coefficients $\beta$ and $\alpha$.

The circuit 84 includes delay networks 120, 122, 124, and 126, multipliers 128, 130, and 132, amplifiers 134, 136, 138, and 140, and a square-root circuit 142. The circuit 84 further includes summing circuits 144 and 146.

The delay network 120, multiplier 128, amplifier 134, summing circuit 144, amplifier 140, and delay network 122 provide or generate the numerator for the expression given above for $R_g(j)$. The components including multiplier 130, amplifier 136, summer 146, and amplifier 138, delay networks 124 and 126, multiplier 132 and the square-root circuit 142 provide the denominator for the value of $R_g(j)$. A dividing circuit 148 divides the numerator by the denominator to provide the value of $R_g(j)$.

A subtractor circuit 150 subtracts the value of $R_g(j)$ from one to provide the value of $\beta$ which is used to set the gain of amplifier 104. A circuit 152 provides the value of $\alpha$ as illustrated which is used to set the gain of amplifier 100. This process is performed during each iteration for the purpose of updating the stochastic average of the previously generated gradients. Also, the same values for $\beta$ and $\alpha$ are used in connection with each of the other filter coefficient generating circuits 82b through 82n.

As can be noted from the Figure, a delay network 154 is coupled between the input 92 and a multiplier 156, and this kind of structure is completed from each coefficient generating circuit. This permits each coefficient to act upon the input signal and the individual results of the each of the coefficients is summed by a summing circuit 160 to provide the resulting output y(j) which results from the filter coefficients process acting upon the signal. As can be noted, the signal y(j) is coupled to the negative input of the summer 86 and the output of the desired filter characteristic processor 62, d(j), is coupled to a positive input of the summer 86. As a result, these two signals are combined to produce the error signal e(j). The error signal is applied to an input of the compare circuit 88 and is compared to a threshold or a predetermined standard 162 applied to the other input of the compare circuit 88. If the error signal is greater than the predetermined standard, the error signal is conveyed through the compare circuit 88 to the multiplier 90 for purposes of generating the new gradient for the next iteration. If the error signal is less than the predetermined standard, the error signal is not conveyed by the compare circuit to stop the iterative process. When the iterative process is completed, the filter coefficients currently at the inputs to the multipliers 156 are the final filter coefficients for the digital filter.

Hence, during each iteration, the adaptive coefficient processor 64a through the circuits 82a through 82n generate a new set of filter coefficients which are updated from the last value of the filter coefficients by an amount dependant upon the stochastic average of the previously generated gradients. In addition, the coefficients generated in each set of coefficients is equal to the number of filter sections of the digital filter.

Figure 4:
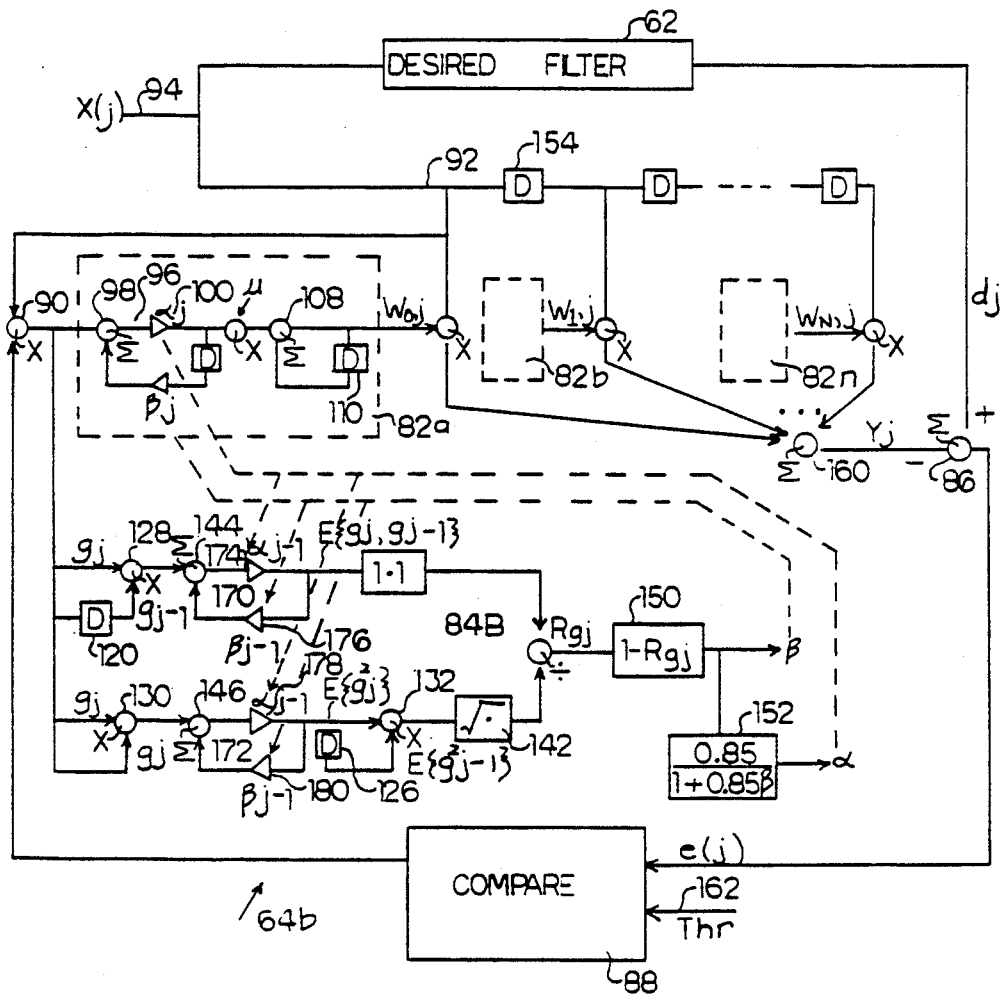
FIG. 4 is a schematic circuit diagram illustrating the manner in which the present invention may be implemented in hardware form in accordance with a second embodiment of the present invention; and, FIG. 5 is a flow chart illustrating the manner in which the present invention may be implemented in microprocessor form in accordance with the first embodiment of the present invention.

Referring now to FIG. 4, it shows another adaptive coefficient processor structured in accordance with a second embodiment of the present invention. The processor 64b is similar to the processor 64a of FIG. 3 and incorporates many of the same components which have been denoted by identical reference characters. However, the difference between the processor 64b and processor 64a is that the stochastic averaging coefficients $\beta$ and $\alpha$ used in the processor 64b are the stochastic average of the coefficients $\beta$ and $\alpha$. To that end, the circuit 84b includes a first single-pole correlator 170 and a second single-pole correlator 172. Correlator 170 includes an amplifier 174 and an amplifier 176 with the gain of amplifier 174 equal to the $\alpha$ of the last time period and the gain of amplifier 176 being equal to the $\beta$ of the last time period. Similarly, the correlator 172 includes amplifiers 178 and 180, wherein the gain of amplifier 178 is the $\alpha$ of the last time period and the gain of amplifier 180 is the $\beta$ of the last time period. Hence, resulting values of $\beta$ and $\alpha$ generated by the circuit 84b represent the stochastic average of the generated and stochastic averaging coefficients.

In the adaptive coefficient processor 64b, since values of $\beta$ and $\alpha$ are now the stochastic averages of those coefficients, the iterative process will converge at a faster rate than the iterative process of processor 64a of FIG. 3. The reason for this is that values of $\beta$ and $\alpha$ are now time-dependant and signal dependent. In all other respects, the processor 64b operates in the same manner of processor 64a of FIG. 3.

Referring now to FIG. 5, it provides a flow chart for implementing the present invention into microprocessor form. Such microprocessors include internal memory which will be referred to in the description of a flow chart of FIG. 5.

In the microprocessor implementation of the present invention, a series of calculations must be performed before the iterative process begins. These steps include step 180 wherein the input signal power (P) is determined and the response $(d_j)$ of the desired filter (DF) to the input signal is calculated. This value dj is the output of the desired filter characteristic In step 182, the value of $\mu$ is determined and is equal to 1 divided by N+1 times the signal power determined in step 180 and wherein N is equal to the number of sections of the adaptive digital filter. In the next step 184 the value of the output (dj) of the desired filter (DF) and the initial adaptive filter state vector are stored in memory and the initial adaptive filter coefficient vector is set to zero.

In step 186, parameter buffer, or memory, is set to zero so that all of the variables such as the gradients are set to zero and the desired number of iterations is stored in memory. In step 188, the output of the adaptive filter y(j) and the error signal are determined. In the next step 190, the first adaptive filter coefficient update is performed utilizing the expression indicated. In the next step 192, the iteration number is set to one.

In step 194, the adaptive filter state vector is updated and in step 196, the output of the adaptive filter is calculated. In step 198, the error signal e(j) is calculated and the gradient for the first iteration is calculated and stored in memory as the gradient of the last iteration. The gradient for the current iteration is then calculated.

In step 200, the error signal is compared to the predetermined standard. If the error signal is less than the predetermined standard, then the iterative process is stopped. If the error signal is not less than the predetermined standard then the process continues to step 202 wherein the values of $R_g(j)$, $\beta$ and $\alpha$ are calculated using the expressions previously described. In step 204, the new adaptive filter coefficient is determined by utilizing the stochastic average of the gradients generated. In the next step 206, it is determined if the number of iterations now exceed the maximum number of iterations. If the answer is "Yes", then the iteration process is stopped. If the answer is "No", then the iterative number is updated by one in step 208, and the process returns to update the memory which contains the new filter coefficient. As a result, the new filter coefficient is available for the subsequent iterative process.

The foregoing continues until the error signal is less than the predetermined standard. When the error signal is less than the predetermined standard, the iterative process is stopped and the filter coefficient value used in the last iteration is utilized as the final coefficient value for the digital filter.

From the foregoing, it can be seen that the present invention provides a new and improved system and method for generating coefficients for use in a digital filter. The system and method of the present invention utilizes an iterative adaptive process which includes a least mean square process and wherein the updated values for the filter coefficients are based upon the stochastic average of the gradients generated during previous iterations. The foregoing results in a system and method for generating coefficients for use in a digital filter which is insensitive to noise in the gradient estimate and which has a fast convergence without having to use an optimal step-size. In accordance with the present invention, the system utilizes a 1-pole correlator to estimate the correlation between the adaptive error and the signal. The correlator is used for fast, efficient gradient estimation rather than to control the step-size as in prior art processes.

While particular embodiments have been shown and described, modifications can be made, and it is therefore intended to cover in the appended claims all such changes and modifications which come within the true spirit and scope of the present invention as defined by the claims.

What is claimed is:

1. A system for generating coefficients for use in a digital filter, said system comprising:
   means for providing data indicative of a desired filter characteristic;
   iterative processing means for generating at least one filter coefficient and a gradient for each said iteration, said iterative processing means including means for generating the stochastic average of said gradients and means for varying said at least one coefficient during each said iterating by an amount relative to said stochastic average of said gradients;
   means for generating an error signal from said desired filter characteristic and said at least open filter coefficient;
   comparing means for comparing said error signal to a predetermined threshold; and
   means for terminating said iterative processing means when said error signal is within a given range of said predetermined threshold.

2. A system as defined in claim 1 further including means of receiving a time-varying input signal, said input signal being applied to said means for providing data indicative of a desired filter characteristic and to said iterative processing means for being acted upon by both said means for providing data indicative of a desired filter characteristic and said iterative processing means for generating a first output from said means for providing data indicative of a desired filter characteristic and a second output from said iterative processing means, wherein said means for generating an error signal is arranged to combine said first and second outputs to generate said error signal, and wherein said comparing means is arranged to compare said error signal to said predetermined threshold for terminating said iterative processing means when said error signal is less than said predetermined threshold.

3. A system as defined in claim 1 wherein said iterative processing means includes means for generating a pair of stochastic averaging coefficients for generating said stochastic average of said gradients.

4. A system as defined in claim 3 wherein said means for generating said pair of stochastic averaging coefficients include means for generating said stochastic averaging coefficients responsive to the stochastic average of said generated stochastic averaging coefficients.

5. A system for generating a set of coefficients of use in a digital filter having one or more sections, said system comprising:
   input means for receiving an applied time-varying signal;
   filter standard means for providing a desired filter characteristic, said filter standard means having an input coupled to said input means for acting upon said applied time-varying signal and having an output for providing a standard filtered signal;
   iterative processing means having an input coupled to said input means for acting upon said applied time-varying signal, said iterative processing means including filter coefficient generating means for generating, during each iteration, a set of filter coefficients equal in number to the number of sections of said digital filter, said iterative processing means having an output for providing an intermediate filtered signal during each iteration;
   combining means for combining said standard filtered signal with said intermediate filtered signal for providing an error signal for each iteration;
   said iterative processing means also including gradient generating means for generating a gradient for each iteration, means for generating the stochastic average of said gradients and coefficient varying means for varying said set of coefficients after each iteration by an amount related to said stochastic average of said gradients; and
   means for terminating said iterative processing means when said error signal is below a predetermined standard; whereby,
   when said iterative processing means is terminated, the current set of coefficients represents the final set of coefficients for said digital filter.

6. A system as defined in claim 5 wherein said gradient generating means is responsive to said error signal for generating said gradients.

7. A system as defined in claim 5 wherein said combining means comprises a summing means having a positive input coupled to said filter standard means output and a negative input coupled to said iterative processing means output for providing said error signal.

8. A system as defined in claim 5 wherein said iterative processing means includes means for generating a pair of stochastic averaging coefficients for generating said stochastic average of said gradients.

9. A system as defined in claim 8 wherein said means for generating said pair of stochastic averaging coefficients include means for generating said stochastic averaging coefficients responsive to the stochastic average of said generated stochastic averaging coefficients.

10. A method for generating coefficients for use in a digital filter, said method comprising the steps of:
    providing a reference filter;
    iteratively generating at least one filter coefficient and a gradient for each iteration by generating the stochastic average of said gradients during each is a iteration and by varying the at least one coefficient during each said iteration by an amount related to the stochastic average of said gradients;
    applying a time-varying signal to said reference filter and to the digital filter employing said at least one generated coefficient;
    comparing the output of said digital filter acting upon said time-varying signal to the output of said reference filter acting upon said time-varying signal; and
    terminating the iterative generation of said at least one coefficient if said output of said digital filter is within a given range of said output of said reference filer.

11. A method as defined in claim 10 wherein said digital filter output is compared to said reference filter output by applying a time-varying signal to said reference filter and said digital filter and comparing the outputs thereof to generate an error signal.

12. A method as defined in claim 11 wherein said comparing step includes summing said output of said reference filter acting upon said time-varying signal with the negative output of said digital filter acting upon said time-varying signal to generate said error signal during each iteration.

13. A method as defined in claim 12 wherein said iterative generation of said at least one coefficient is terminated when said error signal is less than a predetermined standard.

14. A method as defined in claim 10 including the further step of generating a pair of stochastic averaging coefficients for generating said stochastic average of said gradients.

15. A method as defined in claim 14 wherein said step of generation said pair of stochastic averaging coefficients includes generating said pair of stochastic averaging coefficients from the stochastic average of said stochastic averaging coefficients.

16. A method for generating a set of coefficient for use in a digital filter having one or more section, said method comprising the steps of:
providing a reference filer having a desired filter characteristic;
iteratively generating a set of filter coefficients equal in number to the number of sections of said digital filter;
applying said reference filter to a time-varying signal to generate a first output;
applying a digital filer employing said iterative generated set of filter coefficients to said time-varying signal to generate a second output;
combining said first and second outputs to generate an error signal during each iteration;
generating a gradient responsive to said error signal for each iteration; generating the stochastic average of said gradients;
varying said iteratively generated filter coefficients during each iteration by an amount related to said stochastic average of said generated gradients; and
terminating the iterative generation of said set of filter coefficients when said error signal is below a predetermined standard.

17. A method as defined in claim 16 wherein said first and second outputs are combined by summing the first output with the negative of said second output.

18. A method as defined in claim 16 wherein said set of filter coefficients are varied during each iteration by an amount directly related to said stochastic average of said gradients.

19. A method as defined in claim 16 including the further step of generating a pair of stochastic averaging coefficients for generating said stochastic average of said gradients.

20. A method as defined in claim 19 wherein said stochastic averaging coefficients are generated responsive to said stochastic average of said generated stochastic averaging coefficients.

* * * * *

UNITED STATES PATENT AND TRADEMARK OFFICE
CERTIFICATE OF CORRECTION

PATENT NO. : 5,058,047

DATED : October 22, 1991

INVENTOR(S) : Chuck Parker

It is certified that error appears in the above-identified patent and that said Letters Patent is hereby corrected as shown below:

| | |
|---|---|
| Column 1 | lines 35 & 36, after "path," and before "an offset" delete the paragraph break; |
| | lines 37 & 38, change "belo-w" to --below--; |
| Column 7 | line 5, change "FIG. (a)" to --FIG.9(a)--; |
| | line 12, change "FIG.9c)" to --FIG.9(c)--; |
| Column 8 | line 14, change "remove" to --remote--; |
| Column 9 | line 29, change "bobble" to --bubble--; |
| Column 10 | line 23, change "benign" to --bending--; |
| | line 36, change "binding" to --bending--; |
| Column 12 | line 14, change "conduit fore" to --conduit for--. |

UNITED STATES PATENT AND TRADEMARK OFFICE
CERTIFICATE OF CORRECTION

PATENT NO. : 5,058,047
DATED : October 22, 1991
INVENTOR(S) : Chuck Parker It is certified that error appears in the above-identified patent and that said Letters Patent is hereby corrected as shown below:

Column 12 line 14, change "conduit fore" to --conduit for--.

Signed and Sealed this

Sixth Day of April, 1993

*Attest:*

STEPHEN G. KUNIN

*Attesting Officer*     *Acting Commissioner of Patents and Trademarks*